United States Patent [19]
Principi

[11] 4,441,167
[45] Apr. 3, 1984

[54] REPROGRAMMABLE READ ONLY MEMORY

[75] Inventor: Fabio Principi, San Jose, Calif.

[73] Assignee: Raytheon Company, Lexington, Mass.

[21] Appl. No.: 327,144

[22] Filed: Dec. 3, 1981

[51] Int. Cl.³ .............................................. G11C 17/00
[52] U.S. Cl. ...................................... 365/94; 365/100; 365/96
[58] Field of Search ..................... 365/94, 95, 96, 100, 365/103, 104, 105

[56] References Cited

U.S. PATENT DOCUMENTS

| | | | |
|---|---|---|---|
| 3,717,852 | 2/1973 | Abbas et al. | 365/96 |
| 3,764,825 | 10/1973 | Stewart | 365/95 |
| 4,382,289 | 5/1983 | Saitoh | 365/96 |
| 4,384,345 | 5/1983 | Mikome | 365/94 |

FOREIGN PATENT DOCUMENTS 55-67997  5/1980  Japan ..................................... 365/94

OTHER PUBLICATIONS

Simon, "Writable Read–Only Memory Utilizing Electrophoresis", IBM Tech. Disc. Bul., vol. 14, No. 7, 12/71, p. 2084.

*Primary Examiner*—Stuart N. Hecker
*Attorney, Agent, or Firm*—Richard M. Sharkansky

[57] ABSTRACT

A memory is provided having a plurality of addressable memory elements, each one thereof having a first programmable device electrically coupled to a second programmable device, the first programmable device having a normally low resistance characteristic which, when programmed, is changed to a relatively high resistance characteristic, and the second programmable device having a normally high resistance characteristic which, when programmed, is changed to a relatively low resistance characteristic. The first programmable device and second programmable device are serially connected to provide an array of memory elements having a relatively high resistance characteristic in an initial, unprogrammed condition. The memory is first programmed by changing the resistance characteristic of selected ones of the second programmable elements. If it is desired to reprogram the memory, the resistance characteristic of selected ones of the first programmable elements are changed.

6 Claims, 5 Drawing Figures

REPROGRAMMABLE READ ONLY MEMORY

BACKGROUND OF THE INVENTION

This invention relates generally to programmable read-only memories and more particularly to reprogrammable read-only memories.

As is known in the art, it is frequently desirable to use programmable read-only memory (PROM) devices in many digitally controlled apparatus. In many bipolar PROM devices each memory element includes a fusible link which, when remaining in its closed circuit or non-fused condition, represents one logical state and when blown or open-circuited in response to a programming current represents a second logical state. In other PROM devices the use of an insulating material has been suggested for the memory element, such material having a normally relatively high resistance characteristic representing one logical state, and when programmed by applying a relatively high voltage across the material to breakdown the dielectric characteristic, causes such memory element to have a relatively low resistance characteristic representing a second logical state. When either one of the types of circuits changes the logical state initially represented thereby such change is irreversible and hence, when once programmed, the memory element cannot generally be reprogrammed.

SUMMARY OF THE INVENTION

In accordance with the present invention, a memory is provided having a plurality of addressable memory elements, each one thereof having a first programmable device electrically coupled to a second programmable device, the first programmable device having a normally low resistance characteristic which, when programmed, is changed to a relatively high resistance characteristic, and the second programmable device having a normally high resistance characteristic which, when programmed, is changed to a relatively low resistance characteristic. The first programmable device and second programmable device are serially connected to provide an array of memory elements having a relatively high resistance characteristic in an initial, unprogrammed condition. The memory is first programmed by changing the resistance characteristic of selected ones of the second programmable elements. If it is desired to reprogram the memory, the resistance characteristic of selected ones of the first programmable elements is changed.

BRIEF DESCRIPTION OF THE DRAWINGS

The foregoing features of this invention, as well as the invention itself, may be more fully understood from the following detailed description read together with the accompanying drawings, in which:

FIG. 5 is a schematic diagram of an alternative embodiment of an array of reprogrammable read only memory elements according to the invention.

DESCRIPTION OF THE PREFERRED EMBODIMENT

Figure 1:
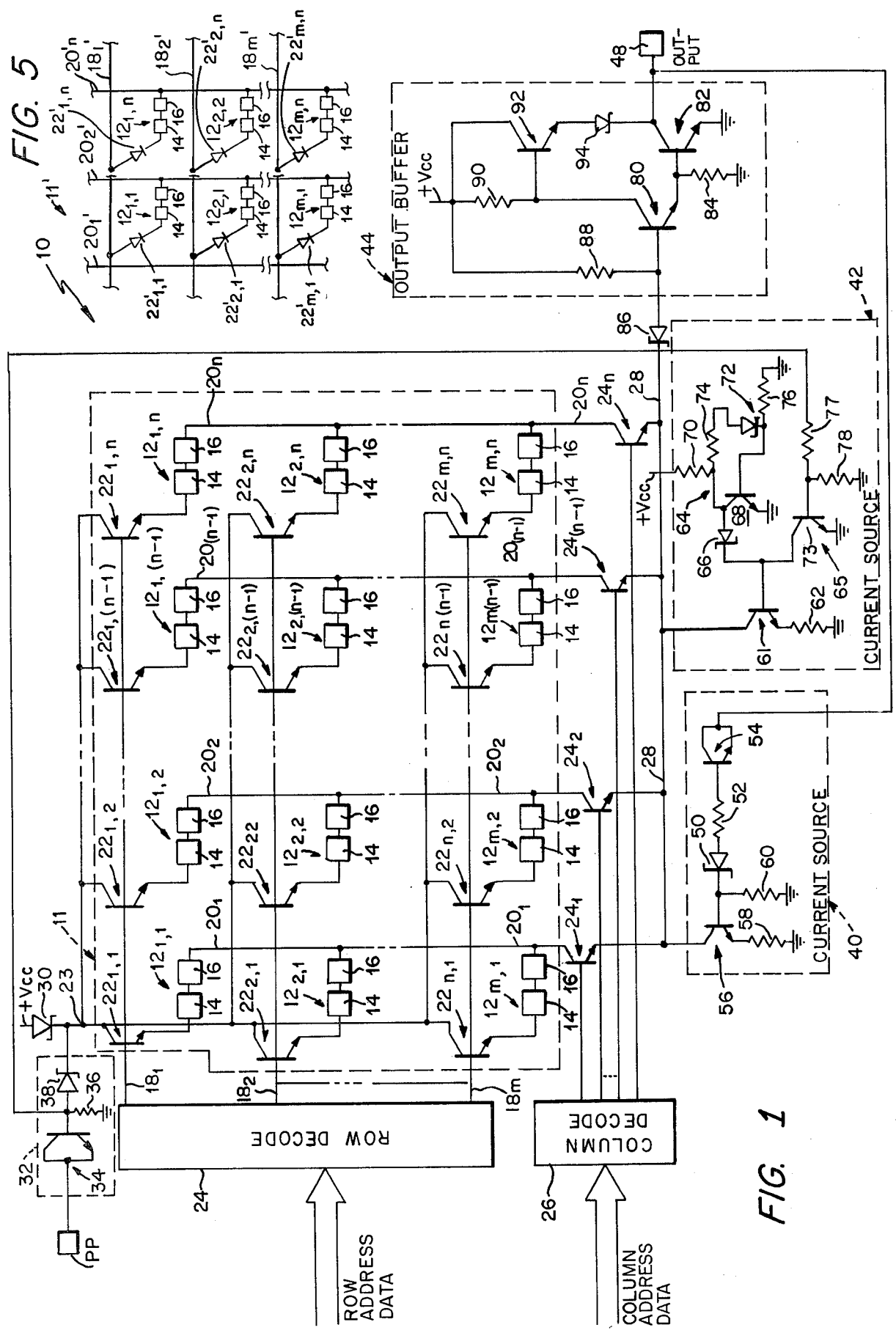
FIG. 1 is a schematic diagram of a reprogrammable read-only memory according to the invention.

Referring now to FIG. 1, a programmable read-only memory (ROM) 10 is shown to include an array 11 of programmable memory elements $12_{1,1}-12_{m,n}$ arranged in a matrix of m rows and n columns, each one of such reprogrammable memory elements $12_{1,1}-12_{m,n}$ including a pair of serially connected programmable devices 14, 16, as shown. Programmable device 14 is here a polycrystalline silicon resistor such as that described in an article entitled "A Novel MOS PROM Using A Highly Resistive Poly-Si Resistor" by Masafumi Tanimoto, Junichi Murota, Yasuo Ohmori and Nobuaki Ieba, published in the IEEE Transactions on Electron Devices, Vol. ED-27, No. 3, March 1980, pages 517-520. Thus, programmable device 14 has a normally relatively high resistance characteristic which, when programmed by applying across it a voltage having a level greater than a predetermined threshold voltage in a manner to be described hereinafter, changes, irreversibly, to a relatively low resistance characteristic. Programmable device 16 is here a fusible link having a normally relatively low resistance characteristic (essentially a short circuit) which, when programmed by passing through the fusible link a current having a level greater than a predetermined level to blow or "open" such fusible link in a manner to be described hereinafter, changes, irreversibly, to a relatively high resistance characteristic (essentially an open circuit or substantially infinite resistance characteristic). It follows then that in the unprogrammed state, each one of the reprogrammable memory elements $12_{1,1}-12_{m,n}$ has a relatively high resistance characteristic which may represent a first logical state, here a logical 1 state. Each one of the reprogrammable memory elements $12_{1,1}-12_{m,n}$ may be initially programmed to represent a logical 0 state by changing, in a manner to be described hereinafter, the resistance characteristic of the programmable device 14 of such one of the memory elements $12_{1,1}-12_{m,n}$ from its normally high resistance characteristic to its low resistance characteristic as mentioned above. Once such one of the memory elements $12_{1,1}-12_{m,n}$ is programmed to represent the logical 0 state it can be subsequently programmed to represent again the logical 1 state by changing, in a manner to be described, the resistance characteristic of the programmable device 16 of such one of the memory elements $12_{1,1}-12_{m,n}$ from its normally low resistance characteristic to its relatively high resistance characteristic as mentioned above.

Each one of the reprogrammable memory elements $12_{1,1}-12_{m,n}$ is electrically coupled between a different pair of m row conductors $12_1-18_m$ and n column conductors $20_1-20_n$ through the base-emitter junction of a different one of n m emitter follower bipolar transistors $22_{1,1}-22_{m,n}$, as shown. The collector electrodes of emitter follower transistors $22_{1,1}-22_{m,n}$ are electrically connected to a common terminal 23 as shown. The base electrodes of each one of the rows of transistors $22_{1,1}-22_{m,n}$ form a corresponding one of the row conductors $18_1-18_m$ and are electrically connected to the output of a conventional row decoder 24, as shown. The column conductors $20_1-20_n$ are connected to the collector electrodes of transistors $24_1-24_n$, respectively, as shown. The base electrodes of transistors $24_1$-$24_n$ are connected to the output of a conventional column decoder 26, as shown. The emitter electrodes of transistors $24_1$-$24_n$ are connected to a common bus 28, as shown.

Terminal 23 is connected to a +Vcc voltage source (here +5 volts) through a Schottky diode 30, as indicated, and is also connected to a program pad, PP, through a program circuit 32, as indicated. Program circuit 32 includes a transistor 34 connected to function as a Zener diode (here a 7 volt Zener diode) having its collector and emitter electrodes connected together and to the program pad PP, as shown, its base electrode connected both to ground through resistor 36, as shown, and to terminal 23 through a Schottky diode 38 as shown.

Bus 28 is connected to a pair of current source circuits 40, 42, and to an output pad 48 through an output inverting buffer 44, as shown. Current source 40 is connected to the output pad 48 and includes a Schottky diode 50, resistor 52, and transistor 54 serially connected, as shown, such transistor 54 being connected to function as a Zener diode (here a 7 volt Zener diode) with the emitter and collector electrodes thereof connected together and to output pad 48, and the base electrode of transistor 54 being connected to resistor 52, as shown. The current source 40 also includes a transistor 56 having its collector electrode connected to bus 28, its emitter electrode connected to ground through a resistor 58, as shown and its base electrode connected to ground through a resistor 60 and to the Schottky diode 50 as shown. Current source 42 includes an output transistor 61 having its collector electrode connected to bus 28, its emitter electrode connected to ground through a resistor 62, as shown, and its base electrode connected to a voltage clamp circuit 64 through a Schottky diode 66, as shown, and to a switching circuit 65 as shown. Clamp circuit 64 includes a transistor 68 having a grounded emitter electrode, a collector electrode connected to the +Vcc supply through a resistor 70, and a base electrode connected to a voltage divider circuit 72. The voltage divider circuit 72 includes a resistor 74 and a Schottky diode 75 serially connected, as shown, between resistors 70 and the base electrode of transistor 68 and a resistor 76 connected between the base electrode of transistor 68 and ground, as shown. The switching circuit 65 includes a grounded emitter transistor 73 having its collector electrode connected to the base electrode of transistor 61. The base electrode of transistor 73 is connected to ground through resistor 78, as shown, and to the base electrode of transistor 34 through a resistor 77 as shown.

Output inverting buffer 44 includes three transistors 80, 82 and 92, the emitter electrode of transistor 80 being connected to ground through resistor 84 and also being connected to the base electrode of grounded emitter transistor 82, as shown. The base electrode of transistor 80 is connected to bus 28 through Schottky diode 86, as shown, and such base electrode is also connected to the +Vcc supply through a resistor 88, as shown. The collector electrode of transistor 80 is connected to the +Vcc supply through a resistor 90 and to the base electrode of transistor 92. The collector electrode of transistor 92 is connected to the +Vcc supply and the emitter electrode of transistor 92 is connected to the collector electrode of transistor 82 through a Schottky diode 94 as shown.

Figures 2, 3, 4:
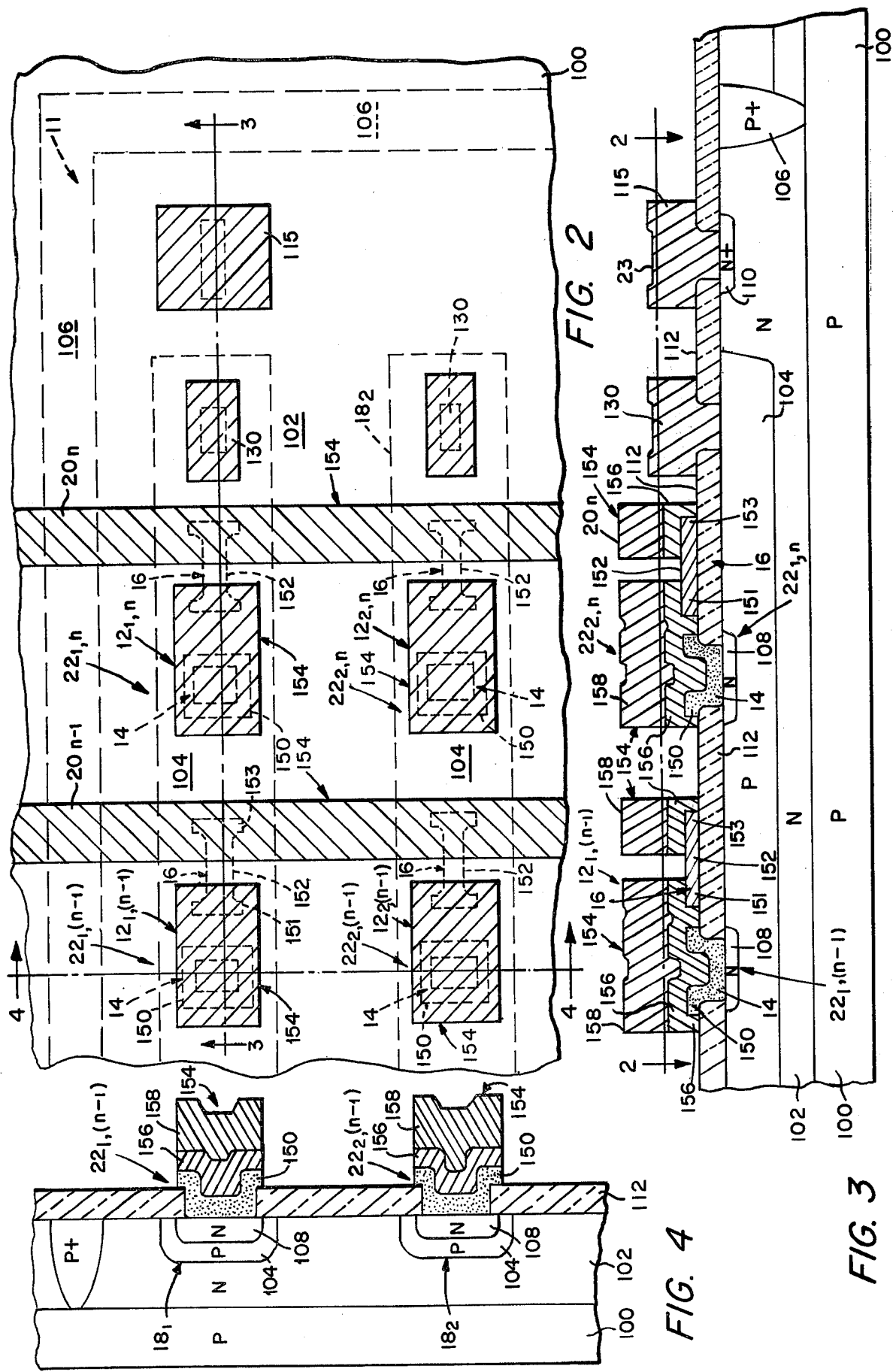
FIG. 2 is a plan view, partially cross-sectioned along line 2—2 in FIG. 3, of a portion of the read-only memory of FIG. 1.
FIG. 3 is a cross-section elevation view of the read-only memory of FIG. 2, such cross-section being taken along line 3—3.
FIG. 4 is a cross-sectional view of the memory shown in FIG. 2, such cross-section being taken along lines 3—3.

Referring now also to FIGS. 2, 3 and 4 a portion of the array 11 of the emitter follower transistors $22_{1,1}$-$22_{m,n}$, reprogrammable memory elements $12_{1,1}$-$12_{m,n}$ and column conductors $18_1$-$18_n$ are shown formed as an integrated circuit. Thus, a p-type conductivity silicon semiconductor substrate 100 is shown having an n-type conductivity epitaxial layer 102 with p-type conductivity base regions 104 and p+type conductivity isolation regions 106 formed therein, n-type conductivity emitter regions 108 formed in the base regions 104, an n+type conductivity collector contact region 110 and a dielectric layer 112 here silicon dioxide formed over the surface of the structure with emitter, base, and collector contact holes formed therein, all arranged and fabricated using conventional integrated circuit processing techniques. Each one of the emitter follower transistors $22_{1,1}$-$22_{m,n}$ and reprogrammable memory elements $12_{1,1}$-$12_{m,n}$ is identical in construction and hence an exemplary one thereof, here emitter follower transistor $22_{1,n}$ and the reprogrammable memory element $12_{1,n}$ will be discussed in detail. Thus, emitter follower transistor $22_{1,n}$ has its collector region formed as part of the epitaxial layer 102. It is noted that such collector region is common to all the emitter follower transistors $22_{1,1}$-$22_{m,n}$ and electrical contact is made to such collector region by the collector contact 115 which may be considered as terminal 23 in FIG. 1. It is noted that the common collector region is electrically isolated from other circuit elements of memory 10 which use the epitaxial layer by the p+type conductivity isolation regions 106. It is further noted that the p-type conductivity base region 104 is common for all the emitter follower transistors in the same row. Thus, transistors $22_{1,1}$-$22_{1,n}$ share a common base region 106 which forms the row conductor $18_1$. Electrical contact to row conductor $18_1$ (i.e. the common p-type base region 104) is made by base contact electrode 130. The n-type conductivity regions 108 form the emitter electrodes of the transistor $22_{1,1}$-$22_{m,n}$ and such emitter electrodes are in electrical contact with a polycrystalline silicon layer 150 which forms the programmable devices 14. Such polycrystalline silicon layer 150 is described in the article referred to above and here is formed to have a threshold voltage of 8 to 10 volts, as mentioned above. Programmable device 16, here a nichrome fusible link 152, is formed on the dielectric layer 112 adjacent to the programmable device 14 using conventional techniques. The upper portion of the polycrystalline silicon layer 150 is electrically connected to one end 151 of the fusible link 152 by an electrical conductor 154, here made up of a lower layer 156 of a mixture of titanium and tungsten and an upper layer 158 of aluminum. Such electrical conductor 154 is used to provide the column conductors $18_1$-$18_n$ and thus is electrically connected to the second end 153 of the fusible link 156 as shown for column conductor $20_{(n-1)}$ and the fusible link of memory element $12_{1,(n-1)}$.

INITIAL PROGRAMMING OPERATION

As mentioned briefly above and referring again to FIG. 1 the memory 10 is first programmed using the programmable devices 14. A relatively high voltage $V_{pp}$ is applied to the program pad PP, such voltage producing a voltage at terminal 23 to back bias diode 30, to: (1) produce a predetermined threshold voltage $V_T$, here 8 to 10 volts, between the emitter electrode of the one of the transistors $22_{1,1}$-$22_{m,n}$ to be selected in accordance with row and column address signals fed to row and column decoders 24, 26 and the selected one of the row conductors $20_1$-$20_n$; and (2) to forward bias transistor 73 to saturation placing transistor 61, and hence current source 42, in a nonconducting condition. The predetermined voltage level $V_T$ at terminal 23 is greater than the threshold voltage which must be applied across the programmable device 14 connected to the emitter of the selected one of the transistors $22_{1,1}$-$22_{m,n}$ to irreversibly change the resistance characteristic of such device 14 from its normally high resistance characteristic to its programmed relatively low resistance characteristic. Here, for example, with a threshold voltage of 8 to 10 volts, the voltage at the programming pad PP is 27 volts so that the voltage at the emitter electrodes of the selected one of the transistors $22_{1,1}$-$22_{m,n}$ is about 19 volts. To program any selected one of the programmable devices 14, an address signal is fed to the row and column decoders 24, 26 to raise the voltage on the base electrodes of the row of transistors $22_{1,1}$-$22_{m,n}$ which is coupled to the selected device 14 and to raise the voltage on the base electrode of the one of the transistors $24_1$-$24_n$ having its collector electrode connected to the one of the column conductors $20_1$-$20_n$ connected to the selected device 14. Thus, if it is desired, for example, to program memory element $12_{2,1}$, and more particularly here the programmable device 14 of such element $12_{2,1}$, address signals are fed to decoders 24, 26 to raise the voltage on line $18_2$ and the voltage on the line connected to the base electrode of transistor $24_1$. To program such selected one of the devices 14, a voltage is fed to the output pad 48 having a level sufficiently high to breakdown the Zener diode functioning transistor 54 and produce a voltage at the base electrode of transistor 56 of current source 40 to enable such transistor 56, and hence current source 40, to limit the amount of current flow through the selected programmable memory element, here element $12_{2,1}$ so that the fusible link portion 16 of such memory element $12_{2,1}$ will not open circuit or blow. For example, here a fusible link will open circuit or blow if a current of about 50 milliamps flows through it; thus here the current source 40 limits the current through to the collector emitter electrodes of transistor 56 to a level significantly less than this fusing current, here such current being limited to about 10 milliamps. The voltage at the base electrode of transistor 56 is here about 2 volts in response to a 10 volt voltage source fed to the output pad 48. It is also noted that since the voltage at the base electrode is about 2 volts and the transistor 56 is in saturation, the voltage at the emitter electrode of transistor 56 is about 1.1 volts. Therefore, resistance of resistor 58 is selected to be here about 110 ohms to limit the current flow through the fusible link to 10 milliamps and thereby prevent such fusible link from becoming an open circuit. It is noted that, as mentioned above, current source 42 is not conducting when the programming voltage $V_{pp}$ is fed to the program pad PP. Further the voltage at the collector electrode of transistor 56 will be about 1.5 volts. Therefore the voltage across programmable device 14 is about 17 volts which exceeds the 8 to 10 volt threshold voltage thereby causing the addressed programmable device 14 to change its resistance characteristic from a normally high characteristic to a low characteristic. It is noted that when the change occurs, the current flow through the serially connected fusible link is limited by current source 40 to 10 ma, which, as mentioned above, is below the fusing current required to open circuit a fusible link. Therefore, the memory element $12_{2,1}$ now has a relatively low resistance characteristic representation of a logical 0 state.

REPROGRAMMING OPERATION

If it is desired to reprogram the memory 10 after the initial program has been stored therein, such initial program having been stored by changing the resistance characteristic of the programmable devices 14 of selected ones of the reprogrammable memory elements $12_{1,1}$-$12_{m,n}$ from its initial high resistance characteristic to its programmed low resistance characteristic, a row and column address signal is fed to address the one of the memory elements $12_{1,1}$-$12_{m,n}$ which is to be reprogrammed. For example, if memory element $12_{2,1}$ is to be reprogrammed, address signals are fed to decoders 24, 26 to raise the voltage on line $18_2$ and to raise the voltage on the base electrode of transistor $24_1$. Next, the programming voltage $V_{pp}$, here 27 volts, is again fed to the programming pad PP thereby to reverse bias diode 30, produce a voltage of about 19 volts at terminal 23, and place transistor 61 of current source 42 again in a nonconducting condition. Here, however, a larger voltage is fed to the output pad 48 as compared to the voltage fed to output pad 48 during the initial programming mode. This larger voltage, here 20 volts, is such that the voltage at the emitter electrode of transistor 56 is about 6.5 volts with the result that about 60 milliamps of current will flow through resistor 58 and hence through the fusible link of the programmable device 16 of the selected one of the reprogrammable memory elements, here memory element $12_{2,1}$. It is noted, therefore, that during the initial programming mode current source 40 limits the current flow through the selected memory element to 10 milliamps, after the resistance of the device 14 is reduced or programmed (preventing the fusible link connected to it from being blown); however, during the reprogramming mode a higher voltage is fed to the output pad 48 to increase the current flow through the current source 40 sufficiently to blow or fuse the selected fusible link. Thus, in response to the 20 volts at the output pad and address signals which place transistors $22_{2,1}$, and $24_1$ into conduction, fusible link of programmable device 14 of reprogrammable memory element $12_{2,1}$ is open circuited and such memory element is reprogrammed to have a relatively high resistance characteristic to again represent a logical 1 state.

READ OPERATION

After the memory 10 has been programmed or reprogrammed as described above, the program stored therein may be read therefrom. During the read operation, the voltage at the programming pad PP is removed so that the diode 30 is forward biased and the voltage at terminal 23 is about 4.5 volts. The voltage at the base of transistor 73 is now less than that required to forward bias transistor 73 to conduction and hence such transistor 73 is placed in the nonconducting mode. However, the clamp circuit 64 becomes electrically connected to the base of transistor 61 to bias transistor 61 to conduction with a voltage at its emitter electrode of about 0.5 volts. Resistor 62 is here 500 ohms so that the current flow through transistor 61 during the read mode is limited to about 1 milliamp and thereby prevents the fusible link of programmable device 14 of a selected one of the memory elements $12_{1,1}$-$12_{m,n}$ from being blown or open circuited during the read operation. It is also noted that in the read mode Zener diode connected transistor 54 will be in an open circuit condition so that no current will flow through resistor 56. To read a selected one of the memory elements $12_{1,1}$-$12_{m,n}$ such selected memory element is addressed by feeding proper address signals to decoders 24, 26, as described above. Here again to address memory element $12_{2,1}$ conductor $18_2$ is raised and the base electrode of transistor $24_1$ is raised. If memory element $12_{2,1}$ had not been initially programmed the resistance of device 14 thereof would be relatively high so that current source 42 will draw current from the +Vcc supply, through resistor 88 (here 5 K ohms) and forward biased Schottky diode 86. Since +Vcc is here 5 volts and resistor 88 is about 5 K ohms, the collector current of transistor 61 will be limited to less than about 100 microamps in order for diode 86 to be forward biased. Therefore, since the voltage at the base of transistor 61 is clamped to produce 0.5 volts at the emitter thereof, resulting in one milliamp flow through resistor 62, substantially all of the 1 milliampere current flow through resistor 62 will be supplied by the base current of transistor 61. Since the beta of transistor 61 is about 40, in order for transistor 61 to supply this 1 milliamp of emitter current transistor 61 is driven into saturation and the voltage between the emitter and collector electrodes thereof becomes about 0.2 volts with the result that the voltage on bus 28 becomes 0.7 volts. This low, 0.7 volt signal on bus 28 is coupled, through forward biased diode 86, to the base electrode of transistor 80 thus preventing transistor 80, as well as transisor 82, from turning "ON". Therefore, a high level voltage will be produced at output terminal 48, such high voltage representing a logical 1 state.

If device 14 of memory element $12_{2,1}$ had been initially programmed, i.e, placed in a low resistance condition, diode 86 will become back-biased and the resistor 62 of current source 42 will draw current from the +Vcc supply, through diode 30, transistor $22_{2,1}$, devices 14 and 16 of memory element $12_{2,1}$, and transistor $24_1$ and such current will be limited to 1 milliampere since the voltage at the base electrode of transistor 61 (and hence the emitter electrode thereof) is clamped by clamp circuit 64 as noted above. It is noted, however, that current will flow from the +Vcc supply through resistor 88 into the base of transistor 80 and to ground through resistor 84 to turn such transistor 80, together with transistor 82, to an "ON" condition thereby producing a low level voltage at output terminal 48, the low voltage represents a logical 0 state.

If memory element $12_{2,1}$ had been reprogrammed by open circuiting the fusible link of device 16 of such element $12_{2,1}$ the current source 42 will again draw its current from the +Vcc supply through resistor 88 and diode 86 so that transistor 61 will again be driven into saturation (for reasons described above), the voltage on bus 28 will be 0.7 volts and transistors 80, 82 will be "OFF". This will again produce a high level voltage at output terminal 48, such high voltage representing a logical 1 state.

Referring now to FIG. 5 an alternative array 11' of reprogrammable read only memory element $12_{1,1}$-$12_{m,n}$ interconnected between row conductors $18'_1$-$18'_m$ and column conductors $20'_1$-$20'_n$ are shown. Such array 11' may be used in place of array 11 of the ROM 10 shown in FIG. 1. Here again each one of the programmable memory elements $12_{1,1}$-$12_{m,n}$ includes a pair of serially connected programmable devices 14, 16. Here, however, the emitter follower transistors $22_{1,1}$-$22_{m,n}$ of the circuit 10 shown in FIG. 1 are replaced with diodes $22_{1,1}'$-$22_{m,n}'$ as shown.

Having described a preferred embodiment of this invention, it will now be apparent to one of skill in the art that other embodiments incorporating its concept may be used. It is felt, therefore, that this invention should not be restricted to the disclosed embodiment but rather should be limited only by the spirit and scope of the appended claims.

What is claimed is:

1. A memory circuit, comprising:
a plurality of addressable non-volatile memory elements each one thereof having a first non-volatile programmable device electrically coupled to a second non-volatile programmable device, the first programmable device having a normally relatively low resistance characteristic which, when programmed, is changed to a relatively high resistance characteristic, and the second programmable device having a normally relatively high resistance characteristic which, when programmed, is changed to a relatively low resistance characteristic.

2. The memory circuit recited in claim 1 wherein the first and second programmable devices are serially connected.

3. The memory circuit recited in claim 1 wherein the first programmable device includes a fusible link.

4. Memory circuit comprising:
a plurality of addressable non-volatile memory elements each one thereof having a first non-volatile irreversibly electrically programmable device electrically coupled to a second non-volatile irreversibly electrically programmable device, the first programmable device having a normally relatively high resistance characteristic which, when programmed, is changed to a relatively high resistance characteristic, and the second programmable device having a normally relatively high resistance characteristic which, when programmed, is changed to a relatively low resistance characteristic.

5. The memory circuit recited in claim 4 wherein the first and second programmable devices are serially connected.

6. The memory circuit recited in claim 4 wherein the first programmable device includes a fusible link.

* * * * *

UNITED STATES PATENT OFFICE
CERTIFICATE OF CORRECTION

Patent No. 4,441,167      Dated April 3, 1984

Inventor(s) Fabio Principi

It is certified that error appears in the above-identified patent and that said Letters Patent are hereby corrected as shown below:

Column 2, Line 57: Change "conductors $12_1$-$18_m$" to --conductors $18_1$-$18_m$--;

Column 3, Line 45: Change "resistors" to --resistor--;

Column 7, Line 23: Change "milliamp" to --milliampere--; and,

Claim 4, Column 8, Line 47: Change "high" to --low--.

Signed and Sealed this

Sixteenth Day of July 1985

[SEAL]

Attest:

DONALD J. QUIGG

Attesting Officer    Acting Commissioner of Patents and Trademarks